US008435805B2

(12) United States Patent
Yonemoto et al.

(10) Patent No.: US 8,435,805 B2

(45) Date of Patent: May 7, 2013

(54) METHOD OF MANUFACTURING A SUBSTRATE FOR LIQUID EJECTION HEAD

(75) Inventors: Taichi Yonemoto, Isehara (JP); Hiroyuki Abo, Tokyo (JP); Keisuke Kishimoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/215,492

(22) Filed: Aug. 23, 2011

(65) Prior Publication Data

US 2012/0058578 A1 Mar. 8, 2012

(30) Foreign Application Priority Data

Sep. 6, 2010 (JP) ................................ 2010-198996

(51) Int. Cl.
*H01L 21/00* (2006.01)

(52) U.S. Cl.
USPC .............................................. 438/21; 347/54

(58) Field of Classification Search ..................... 438/21
See application file for complete search history.

(56) References Cited

U.S. PATENT DOCUMENTS

| | | | | |
|---|---|---|---|---|
| 7,416,281 | B2 * | 8/2008 | Nishimura et al. | 347/54 |
| 7,753,495 | B2 * | 7/2010 | Hayakawa et al. | 347/64 |
| 8,338,195 | B2 * | 12/2012 | Sasaki et al. | 438/21 |
| 2002/0122101 | A1 * | 9/2002 | Yabe | 347/65 |
| 2004/0051817 | A1 * | 3/2004 | Takahashi et al. | 349/1 |
| 2004/0174407 | A1 * | 9/2004 | Hayakawa et al. | 347/20 |
| 2006/0191862 | A1 * | 8/2006 | Hayakawa et al. | 216/27 |
| 2010/0212159 | A1 * | 8/2010 | Takahashi et al. | 29/890.1 |
| 2010/0216260 | A1 * | 8/2010 | Takahashi | 438/10 |
| 2010/0216264 | A1 | 8/2010 | Matsumoto et al. | |
| 2011/0151598 | A1 * | 6/2011 | Abo et al. | 438/21 |
| 2012/0028384 | A1 * | 2/2012 | Sasaki et al. | 438/21 |

FOREIGN PATENT DOCUMENTS

JP 2007-160625 A 6/2007

* cited by examiner

*Primary Examiner* — Thao P. Le

(74) *Attorney, Agent, or Firm* — Fitzpatrick, Cella, Harper & Scinto

(57) ABSTRACT

Provided is a method of manufacturing a substrate for liquid ejection head, including: forming a groove portion by etching on one surface side of a silicon substrate, the groove portion being formed so as to surround a portion at which a liquid supply port is to be formed on an inner side of the groove portion; forming a protective layer on the one surface side of the silicon substrate, the protective layer being formed inside the groove portion and on an outer side of the groove portion; and forming the liquid supply port by subjecting the silicon substrate to crystal anisotropic etching treatment with use of the protective layer as a mask.

10 Claims, 3 Drawing Sheets

METHOD OF MANUFACTURING A SUBSTRATE FOR LIQUID EJECTION HEAD

BACKGROUND OF THE INVENTION

1. Field of the Invention

The present invention relates to a method of manufacturing a substrate for liquid ejection head to be used for a liquid ejection head which ejects liquid such as ink liquid.

2. Description of the Related Art

In recent years, in an ink jet recording head, increase in the number of ink supply ports and narrowing of pitches between the ink supply ports have been progressing. In this trend, it is required to surely secure an adhering area between a rear surface of a substrate of an ink jet recording head provided with supply ports and a support member for supporting the ink jet recording head, to thereby maintain an adhering strength. Therefore, in order to maintain the adhering area, it is desired to reduce fluctuations in shape of the ink supply ports. However, in some cases, an opening accuracy of the ink supply port reduces because of flaws and defects in a silicon substrate, flaws in an etching mask, and the like.

To address this, in Japanese Patent Application Laid-Open No. 2007-160625, there is proposed a method of forming a protective layer as an etching mask after forming a functional portion formed of a flow path forming member and the like and before forming the ink supply port, the protective layer being formed by low temperature sputtering after grinding or polishing the rear surface of the substrate to eliminate the flaws.

However, in the substrate subjected to grinding or polishing to eliminate the defect portion, due to the grinding or the polishing, an etching rate (side etching rate) progressed in a surface direction of the substrate fluctuates. In this case, it is possible to improve the accuracy, but it becomes difficult to form the opening correspondingly to the etching mask.

SUMMARY OF THE INVENTION

Therefore, the present invention has an object to provide a method of manufacturing a substrate for liquid ejection head, which is capable of suppressing an influence to be caused by defects such as flaws in the substrate, and improving an accuracy of an opening dimension of a liquid supply port.

For this purpose, according to the present invention, there is provided a method of manufacturing a substrate for liquid ejection head, including: forming a groove portion by etching on one surface side of a silicon substrate, the groove portion being formed so as to surround a portion at which a liquid supply port is to be formed on an inner side of the groove portion; forming a protective layer on the one surface side of the silicon substrate, the protective layer being formed inside the groove portion and on an outer side of the groove portion; and forming the liquid supply port by subjecting the silicon substrate to crystal anisotropic etching treatment with use of the protective layer as a mask.

Further features of the present invention will become apparent from the following description of exemplary embodiments with reference to the attached drawings.

DESCRIPTION OF THE EMBODIMENTS

The present invention relates to a method of forming a liquid supply port in a silicon substrate, and more particularly, to a method of manufacturing a substrate for liquid ejection head to be used in a liquid ejection head.

Note that, in the following description, an ink jet recording head is exemplified as an application example of the present invention, but the application range of the present invention is not limited thereto. The present invention may also be applied to a liquid ejection head to be used in biochip manufacturing or electronic circuit printing. Examples of the liquid ejection head may include, other than the ink jet recording head, a head for color filter manufacturing.

First, in the present invention, on one surface side of a silicon substrate, a groove portion is formed by etching so as to surround a portion at which a liquid supply port is to be formed on its inner side. Then, on the one surface side of the silicon substrate, a protective layer is formed inside the groove portion and on the outer side of the groove portion. Further, with the use of the protective layer as a mask, the silicon substrate is subjected to crystal anisotropic etching treatment, to thereby form the liquid supply port.

In the present invention, a wall surface of the groove portion, that is, a side wall and a bottom wall thereof corresponds to a progressing surface of the crystal anisotropic etching. The wall surface of the groove portion is formed by etching in a step of the present invention, and hence it is possible to suppress generation of flaws and the like in the substrate, which may have been generated prior to the step. Therefore, according to the present invention, it is possible to reduce fluctuations in opening dimension, and to form the liquid supply port with high accuracy.

Further, it is preferred that the liquid supply port be formed so that the side wall on the inner side of the groove portion becomes an opening end portion of the liquid supply port.

Further, it is preferred that the liquid supply port be formed by providing a guide hole in the silicon substrate, and then subjecting the silicon substrate to the crystal anisotropic etching treatment.

Further, it is preferred that the liquid supply port be formed by further subjecting the silicon substrate to dry etching treatment after the crystal anisotropic etching treatment.

Hereinafter, an embodiment of the present invention is described in detail.

Figure 2:
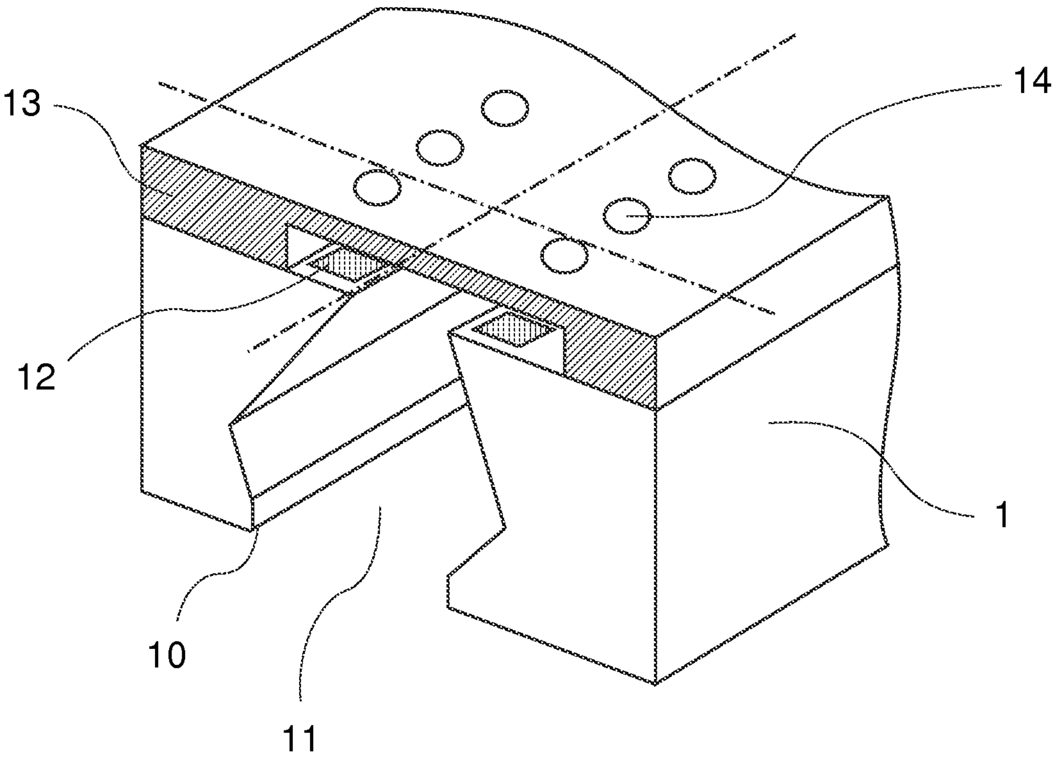
FIG. 2 is a schematic perspective view of a liquid ejection head.

FIG. 2 is a perspective view illustrating an example of an ink jet recording head according to this embodiment. As illustrated in FIG. 2, the ink jet recording head of this embodiment includes a substrate 1, multiple ejection orifices 14, and a flow path forming member 13 fixed to the substrate 1. In the substrate, an ink supply port 11 for supplying ink to the ejection orifices 14 is formed. Inside the ink supply port, there is formed a groove trace 10 engraved in a direction perpendicular to a surface direction of the substrate from a rear surface (lower surface in FIG. 2) of the substrate toward a front surface (upper surface in FIG. 2). The groove trace 10 corresponds to the side wall of the groove portion.

Figure 1A:
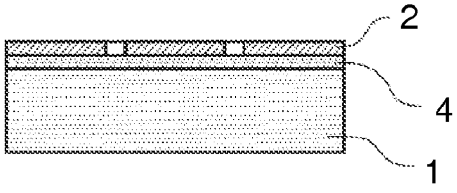
FIGS. 1A, 1B, 1C, 1D, 1E, 1F, 1G, and 1H are cross-sectional views illustrating steps of a method of manufacturing a substrate for ink jet recording head according to an embodiment of the present invention.
Figure 1B:
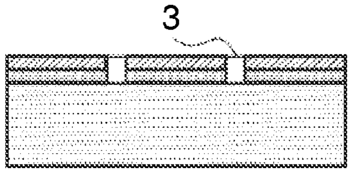
Figure 1C:
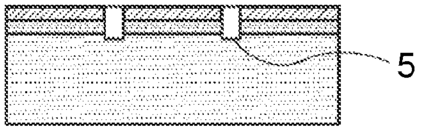
Figure 1D:
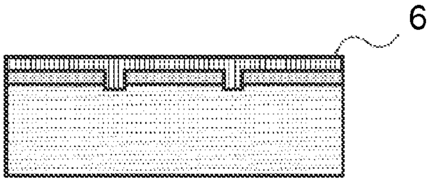
Figure 1E:
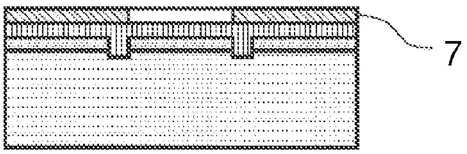
Figure 1F:
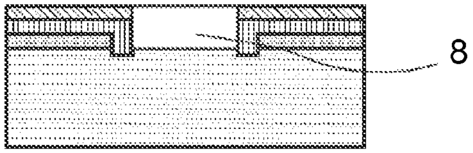
Figure 1G:
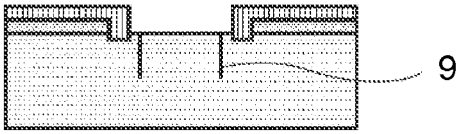
Figure 1H:
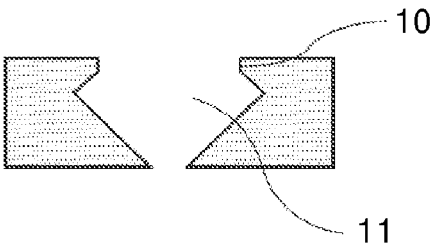

As illustrated in FIG. 1H, the ink supply port 11 is formed into a shape that passes through the substrate 1. As illustrated in FIG. 1H, as for an orientation plane of the side wall (inner wall) of the ink supply port 11, the (111) plane continuous from an opening portion on the rear surface side (upper surface side in FIG. 1H) and the (111) plane continuous from an opening portion on the front surface side (lower surface side in FIG. 1H) intersect with each other at an intermediate portion in a thickness direction of the substrate 1. Alternatively, the shape of the ink supply port 11 may be formed so that, as for the orientation plane inside the ink supply port 11, the (111) plane is formed from the rear surface side, the continuous (110) plane is formed from the front surface side, and those planes intersect with each other at the intermediate portion in the thickness direction of the substrate 1. Alternatively, the ink supply port 11 may be formed by the (111) plane continuous from the rear surface side to the front surface side.

With reference to FIGS. 1A to 1H, a method of manufacturing a substrate for ink jet recording head according to this embodiment is described. Note that, a finished head state of this embodiment is illustrated in FIG. 2. Further, in FIGS. 1A to 1H, a heating element 12 as an energy discharge element formed on the substrate 1, wiring for driving the heating element 12, and ink flow paths to the ejection orifices 14 are not illustrated, and description of steps of forming the heating element 12 and the wiring is omitted in this embodiment.

Figure 3:
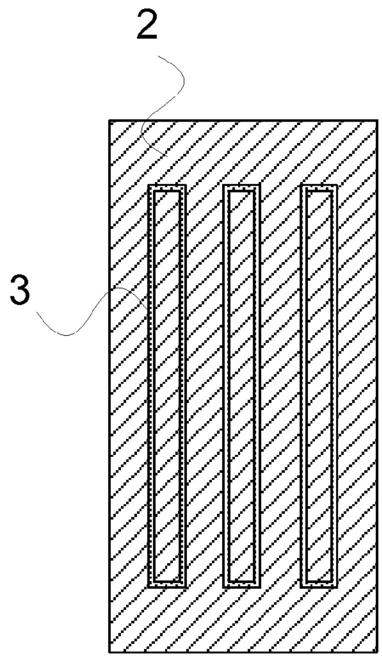
FIG. 3 is a schematic plan view of a rear surface side of the substrate in the step illustrated in FIG. 1B.
Figure 4:
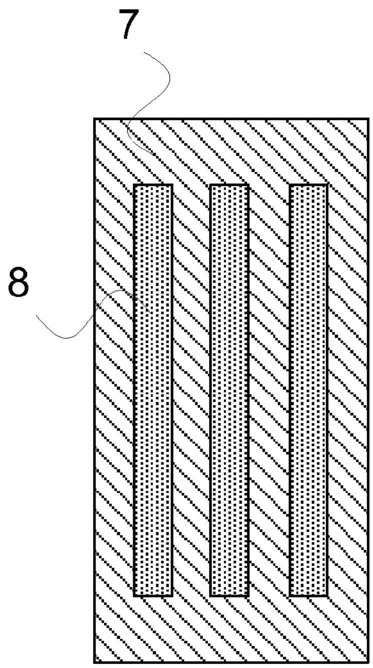
FIG. 4 is a schematic plan view of the rear surface side of the substrate in the step illustrated in FIG. 1F.

FIGS. 1A to 1H are cross-sectional views illustrating main steps of this embodiment. Further, FIG. 3 is a plan view of the rear surface side (upper side in FIGS. 1A to 1H) of the substrate 1 in the step illustrated in FIG. 1B. Further, FIG. 4 is a plan view of the rear surface side (upper side in FIGS. 1A to 1H) of the substrate 1 in the step illustrated in FIG. 1F. Note that, in FIGS. 3 and 4, the same reference symbols are used to represent the same members as those of FIGS. 1A to 1H.

First, as illustrated in FIG. 1A, a first protective layer 4 is formed on the rear surface side of the silicon substrate 1. On the first protective layer 4, a first resist mask 2 having a pattern corresponding to the groove portion is formed.

Specifically, a positive resist is coated by spin coating on the rear surface (upper surface in FIG. 1A) of the substrate. After that, exposure and development are performed, to thereby form the first resist mask 2 having the pattern corresponding to the groove portion. As the positive resist, for example, IP5700 (trade name, manufactured by TOKYO OHKA KOGYO CO., LTD.) may be used.

Next, as illustrated in FIG. 1B, the first protective layer 4 is subjected to etching, and a first opening 3 for forming a groove portion 5 is formed. The opening shape of the first opening 3 is illustrated in FIG. 3.

As a material used for the first protective layer 4, a metal oxide film or a metal nitride film, which has alkaline resistance and is removable, can be used. Examples of the material used for the first protective layer 4 include a silicon oxide film, a silicon nitride film, and an aluminum oxide film, and more specifically, include SiN, $SiO_2$, $Al_2O_3$, and $Si_3N_4$. For example, in a case where $SiO_2$ is used as the first protective layer, there may be used a thermally-oxidized film formed by performing thermal oxidation of the silicon substrate.

Next, as illustrated in FIG. 1C, dry etching is performed with the use of the first resist mask 2 as a mask. In this manner, the substrate is subjected to etching in a direction perpendicular to the plane of the substrate 1 with the first opening 3 as an etching start surface. Thus, the groove portion 5 is formed on the one surface side of the substrate.

The wall surface of the groove portion is formed by etching in this step, and hence generation of defects such as flaws may be suppressed. Therefore, in the crystal anisotropic etching treatment performed after this step, fluctuations in etching rate can be suppressed.

As a method of etching to form the groove portion, for example, a dry etching may be employed. The type of the dry etching is not particularly limited, and, for example, an etching method using plasma such as reactive ion etching (RIE) may be employed.

A gas used in the dry etching is not particularly limited, and a well-known etching gas for a silicon substrate may be used. Examples of the etching gas include any reactive gas containing atoms of any one of carbon, chlorine, sulfur, fluorine, oxygen, hydrogen, and argon, and molecules constituted of those atoms. Examples of the reactive gas include $SF_6$ and $CF_4$.

The groove portion 5 is formed on the one surface side (rear surface side) of the silicon substrate so as to surround a portion at which the liquid supply port is to be formed on its inner side. Note that, inside the groove portion 5, there are formed a side wall on an inner side (side on which the liquid supply port is to be formed) and a side wall on an outer side (opposite side to the side on which the liquid supply port is to be formed).

The width of the groove portion 5 can be determined by considering an amount to be etched in a direction parallel to the rear surface of the substrate 1 (side etching amount) during a processing time period required for the formation of the ink supply port 11. The width and the depth of the groove portion can be selected by considering a condition of an etching rate and the like in a crystal anisotropic etching in a step later.

Further, the first opening 3 and the groove portion 5 can be formed by step etching using dry etching. In this case, when the thermally-oxidized film is used as the first protective layer 4, as an etching gas, for example, a fluorine gas and a reactive gas containing argon may be used. Examples of the fluorine gas include $C_4F_6$ and $C_4F_8$.

Next, after the first resist mask 2 is removed, as illustrated in FIG. 1D, a second protective layer 6 is formed inside the groove portion 5 and on the first protective layer 4, that is, on the outer side of the groove portion.

The material of the second protective layer 6 is not particularly limited as long as the material has resistance in the crystal anisotropic etching. The material of the second protective layer is preferred to be a material having an adhesion strength which is capable of obtaining a stable permeated amount of an etchant between the substrate 1 and the second protective layer 6. As such a material, a material similar to that of the first protective layer 4 can be used. Examples of the material include a silicon oxide film, a silicon nitride film, and an aluminum oxide film, and more specifically, include $SiO_2$, SiN, $Al_2O_3$, and $Si_3N_4$.

As a method of forming the second protective layer, for example, a plasma CVD method or a sputtering method may be employed.

The thickness of the second protective layer may be selected so that the second protective layer is resistant to an etchant such as a strong alkaline solution used in the crystal anisotropic etching.

Further, the second protective layer may be formed by coating a resist such as polysilazane.

Further, in order to simplify the manufacturing step when a second opening 8 is formed in a step later, the first protective layer 4 and the second protective layer 6 are desired to be made of the same material. With the steps described above, the second protective layer 6 is formed inside the groove portion and on the outer side of the groove portion.

Next, as illustrated in FIG. 1E, by a photolithography technology, a positive resist is patterned, to thereby form a second resist mask 7.

Next, as illustrated in FIG. 1F, with the use of the second resist mask 7, a region on the inner side of the groove portion of the second protective layer 6 is subjected to etching, to thereby form the second opening 8 which exposes the etching start surface in a bottom portion thereof. The pattern of the second opening 8 is illustrated in FIG. 4. The region on the inner side of the groove portion of the second protective layer 6 refers to a portion of the second protective layer present on the inner side of the side wall on the inner circumference side of the groove portion in the surface direction. The outer side of the groove portion refers to the opposite side to the region on the inner side.

For example, in the case where the second protective layer 6 is formed of the thermally-oxidized film, the first protective layer 4 and the second protective layer 6 can be collectively removed by buffered hydrogen fluoride.

Next, after the second resist mask 7 is removed, the ink supply port 11 is formed. When the ink supply port is formed, as illustrated in FIG. 1G, it is preferred to form a guide hole 9 by, for example, a laser.

Next, as illustrated in FIG. 1H, the silicon substrate is subjected to crystal anisotropic etching, to thereby form the ink supply port 11. Reference numeral 10 shows a groove trace.

In the crystal anisotropic etching, it is preferred that the side wall on the inner side of the groove portion 5 become the opening end portion of the ink supply port. This can be adjusted as appropriate depending on the condition of the crystal anisotropic etching or the shape of the groove portion such as the width and the depth.

In the crystal anisotropic etching, an etchant containing an alkaline aqueous solution may be used. As the etchant, for example, TMAH may be used, and further, for example, KOH, EDP, hydrazine, and the like may be used. Those materials can generate a difference in etching rate in the crystal plane.

After the ink supply port 11 is formed, the first protective layer 4 and the second protective layer 6 are removed. However, the first protective layer 4 and the second protective layer 6 may be removed as necessary, or may not be removed.

By manufacturing the ink jet recording head as in this embodiment, the width of the opening on the rear surface is controlled by the groove portion 5, and thus the undulation due to the openings is suppressed and a stable shape is obtained. In this manner, it is possible to ensure an adhering area between the chip plate and the chip.

Further, inside the ink supply port, a perpendicular plane orthogonal to the rear surface of the substrate is formed, and thus the rigidity of the rear surface portion of the substrate increases to improve the quality.

Example

Referring to FIGS. 1A to 1H, a method of manufacturing a substrate for ink jet recording head according to an example is described. Note that, a finished head state of the example is illustrated in FIG. 2.

As illustrated in FIG. 1A, the first protective layer 4 was formed on the rear surface (upper surface in FIG. 1A) of the silicon substrate 1. On the first protective layer 4, the first resist mask 2 having a pattern corresponding to the groove portion was formed.

The first protective layer 4 was formed by thermal oxidation of the silicon substrate.

The first resist mask 2 was formed by, after coating a positive resist by spin coating on the rear surface of the silicon substrate 1, performing exposure and developing processing. As the positive resist, IP5700 (trade name, manufactured by TOKYO OHKA KOGYO CO., LTD.) was used.

Next, as illustrated in FIG. 1B, the first protective layer 4 was subjected to etching, and the first opening 3 for forming the groove portion 5 was formed. The opening shape of the first opening 3 is illustrated in FIG. 3.

Next, as illustrated in FIG. 1C, dry etching was performed with the use of the first resist mask 2 as a mask. In this manner, the substrate was subjected to etching in a direction perpendicular to the plane of the substrate 1 with the first opening 3 as an etching start surface. Thus, the groove portion 5 was formed.

The etching was performed by step etching of dry etching.

The groove portion 5 was formed on the rear surface of the silicon substrate so as to surround a portion at which the liquid supply port is to be formed on its inner side.

Next, the first resist mask 2 was removed, and then, as illustrated in FIG. 1D, the second protective layer 6 was formed inside the groove portion 5 and on the first protective layer 4.

Next, as illustrated in FIG. 1E, by a photolithography technology, the positive resist was patterned, and thus the second resist mask 7 was formed.

Next, as illustrated in FIG. 1F, the second protective layer 6 was subjected to etching with the use of the second resist mask 7, and thus the second opening 8 which exposes the etching start surface in a bottom portion thereof was formed. The pattern of the second opening 8 is illustrated in FIG. 4.

Next, the second resist mask 7 was removed, and then, as illustrated in FIG. 1G, the guide hole 9 was formed by a laser.

Next, as illustrated in FIG. 1H, the ink supply port 11 was formed by crystal anisotropic etching. The crystal anisotropic etching was performed so that the side wall on the inner side of the groove portion 5 became the opening end portion of the ink supply port.

After forming the ink supply port 11, the first protective layer 4 and the second protective layer 6 were removed.

The groove portion 5 and the second protective layer 6 were formed by the following method as an example. The silicon substrate having the rear surface that was subjected to dry etching by 20 μm, on which an $SiO_2$ film was formed by ECR sputtering, was subjected to crystal anisotropic etching using a TMAH 22 wt % aqueous solution of 83° C. At this time, the side etching rate at the bottom portion of the groove portion 5 was about 0.02 μm/min. The side etching rate of the substrate, on which an $SiO_2$ film was formed without being subjected to dry etching, the substrate having an oxidation-induced stacking fault (hereinafter, referred to as OSF) generated therein, was 0.2 μm/min. As a result, it was possible to suppress the side etching amount caused by the OSF. Further, when an etchant having a similar condition was used, the etching rate of $SiO_2$ was about $0.56\times10^{-4}$ μm/min. For example, when it is assumed that the crystal anisotropic etching is performed for 1,000 minutes, by setting the thickness of the second protective layer 6 to $560\times10\times10^{-4}$ μm or larger, it was possible to protect the engraved groove portion 5.

With the structure of the present invention, the liquid supply port can be formed while suppressing the influence to be caused by defects such as flaws in the silicon substrate. Therefore, according to the present invention, it is possible to provide a method of manufacturing a substrate for liquid ejection head which is capable of forming the liquid supply port with good accuracy while reducing the fluctuations of the opening dimensions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-198996, filed Sep. 6, 2010, which is hereby incorporated by reference herein in its entirety.

What is claimed is:

1. A method of manufacturing a substrate for liquid ejection head comprising:

forming a groove portion by etching at one surface side of a silicon substrate;

forming a protective layer at the one surface side of the silicon substrate, the protective layer being formed inside the groove portion and at an outer side of the groove portion; and forming the liquid supply port by subjecting the silicon substrate to crystal anisotropic etching treatment from the one surface side with use of the protective layer as a mask, wherein the liquid supply port is open to a region surrounded by the groove portion when the silicon substrate is viewed from the one surface side.

2. The method of manufacturing a substrate for liquid ejection head according to claim 1, wherein the forming the liquid supply port is carried out so that a side wall on an inner side of the groove portion becomes an opening end portion of the liquid supply port.

3. The method of manufacturing a substrate for liquid ejection head according to claim 1, further comprising forming a guide hole in the silicon substrate prior to the subjecting the silicon substrate to crystal anisotropic etching treatment.

4. The method of manufacturing a substrate for liquid ejection head according to claim 1, wherein the forming the liquid supply port further comprises, after the subjecting the silicon substrate to crystal anisotropic etching treatment, subjecting the silicon substrate to dry etching treatment.

5. The method of manufacturing a substrate for liquid ejection head according to claim 1, wherein the protective layer comprises a first protective layer and a second protective layer; and wherein the method further comprises:

(1) forming the first protective layer at the one surface side of the silicon substrate, forming, in the first protective layer, a first opening which exposes an etching start surface of the groove portion, and subjecting the silicon substrate to etching from the first opening, to thereby form the groove portion;

(2) forming the second protective layer at a surface on a side opposite to a side where the silicon substrate of the first protective layer is positioned and inside the groove portion, and subjecting a region of the first protective layer and a region of the second protective layer which are at the inner side of the groove portion to etching to expose the silicon substrate, to thereby form a second opening; and (3) subjecting the silicon substrate to the crystal anisotropic etching treatment from the second opening, to thereby form the liquid supply port.

6. The method of manufacturing a substrate for liquid ejection head according to claim 5, wherein the second protective layer comprises any one of a silicon oxide film, a silicon nitride film, and an aluminum oxide film.

7. The method of manufacturing a substrate for liquid ejection head according to claim 1, wherein the forming the groove portion is carried out by dry etching.

8. The method of manufacturing a substrate for liquid ejection head according to claim 7, wherein the dry etching comprises a step etching.

9. The method of manufacturing a substrate for liquid ejection head according to claim 3, wherein the forming the guide hole is carried out by a laser.

10. The method of manufacturing a substrate for liquid ejection head according to claim 1, wherein the forming the groove portion is carried out so that a wall surface thereof is perpendicular to a surface direction of the silicon substrate.

* * * * *